(12) United States Patent
Byun

(10) Patent No.: US 11,336,851 B2
(45) Date of Patent: May 17, 2022

(54) IMAGE SENSING DEVICE

(71) Applicant: SK hynix Inc., Icheon-si (KR)

(72) Inventor: Kyung Su Byun, Cheongju-si (KR)

(73) Assignee: SKhynix Inc., Icheon-si (KR)

( * ) Notice: Subject to any disclaimer, the term of this patent is extended or adjusted under 35 U.S.C. 154(b) by 56 days.

(21) Appl. No.: 16/880,657

(22) Filed: May 21, 2020

(65) Prior Publication Data

US 2021/0152766 A1 May 20, 2021

(30) Foreign Application Priority Data

Nov. 15, 2019 (KR) .................. 10-2019-0146534

(51) Int. Cl.
*H04N 5/369* (2011.01)
*H01L 27/146* (2006.01)

(52) U.S. Cl.
CPC ....... *H04N 5/369* (2013.01); *H01L 27/14627* (2013.01)

(58) Field of Classification Search
CPC .............. H04N 5/369; H01L 27/14627; H01L 27/1464; H01L 27/14636
See application file for complete search history.

(56) References Cited

U.S. PATENT DOCUMENTS

| 7,667,286 | B2 * | 2/2010 | Toshikiyo | ......... | H01L 27/14632 |
| | | | | | 257/435 |
| 8,018,508 | B2 * | 9/2011 | Toshikiyo | .......... | G02B 27/4205 |
| | | | | | 348/272 |
| 8,168,938 | B2 | 5/2012 | Toda | | |
| 9,159,761 | B2 | 10/2015 | Kokubun | | |
| 2005/0051860 | A1 * | 3/2005 | Takeuchi | .......... | H01L 27/14843 |
| | | | | | 257/436 |
| 2006/0284052 | A1 * | 12/2006 | Toshikiyo | ......... | H01L 27/14685 |
| | | | | | 250/208.1 |
| 2006/0285228 | A1 * | 12/2006 | Ishii | .................... | G02B 27/4205 |
| | | | | | 359/742 |
| 2007/0164329 | A1 * | 7/2007 | Toshikiyo | ......... | H01L 27/14627 |
| | | | | | 257/291 |
| 2008/0011937 | A1 * | 1/2008 | Toshikiyo | ......... | H01L 27/14632 |
| | | | | | 250/208.1 |
| 2008/0076039 | A1 * | 3/2008 | Ishii | ...................... | G03F 7/0005 |
| | | | | | 430/5 |
| 2009/0090937 | A1 * | 4/2009 | Park | .................. | H01L 27/14627 |
| | | | | | 257/252 |

(Continued)

*Primary Examiner* — Shahbaz Nazrul
(74) *Attorney, Agent, or Firm* — Perkins Coie LLP

(57) ABSTRACT

An image sensing device is disclosed. The image sensing device includes a semiconductor substrate and a lens layer. The semiconductor substrate includes a first surface and a second surface opposite to the first surface, and includes a photoelectric conversion element that generates photocharges in response to light incident to the photoelectric conversion element via the first surface. The lens layer is disposed over the semiconductor substrate to direct light through the first surface of the semiconductor substrate into the substrate lens which further directs the incident light into the photoelectric conversion element. The semiconductor substrate is structured to include a substrate lens formed by etching the first surface to a predetermined depth and located between the first surface and the photoelectric conversion element to direct incident light via the first surface to the photoelectric conversion element.

20 Claims, 13 Drawing Sheets

(56) References Cited

U.S. PATENT DOCUMENTS

| | | | |
|---|---|---|---|
| 2009/0141153 A1* | 6/2009 | Onozawa | H01L 27/14627 |
| | | | 348/294 |
| 2010/0134675 A1 | 6/2010 | Toyota | |
| 2011/0221022 A1* | 9/2011 | Toda | H01L 27/14625 |
| | | | 257/432 |
| 2014/0103478 A1* | 4/2014 | Usuda | H01L 27/14627 |
| | | | 257/432 |
| 2014/0191356 A1* | 7/2014 | Kouyama | H01L 27/14627 |
| | | | 257/443 |

* cited by examiner

IMAGE SENSING DEVICE

CROSS-REFERENCE TO RELATED APPLICATION

This patent document claims the priority and benefits of Korean patent application No. 10-2019-0146534, filed on Nov. 15, 2019, which is incorporated by reference in its entirety as part of the disclosure of this patent document.

TECHNICAL FIELD

The technology and implementations disclosed in this patent document generally relate to an image sensing device.

BACKGROUND

An image sensor is a semiconductor device for converting an optical image into electrical signals. With the recent development of computer industries and communication industries, demand for high-quality and high-performance image sensors has been rapidly increasing in various fields and applications, including, for example, digital cameras, camcorders, personal communication systems (PCSs), game consoles, surveillance cameras, medical micro-cameras, robots, etc.

In order to acquire a three-dimensional (3D) image using the image sensor, color information of the 3D image and the distance (or depth) between a target object and the image sensor are needed.

Techniques for acquiring information about the distance between the target object and the image sensor may be classified into passive methods and active methods.

The passive methods may calculate the distance between the target object and the image sensor using only image information of the target object without actively emitting light to the target object to obtain additional measurements beyond the image captured by the image sensor. The passive method can be applied to stereo cameras.

The active methods direct light to the target object to obtain additional measurements about the object-sensor distance and may be classified into a triangulation method, a Time of Flight (TOF) method, etc. After light has been emitted from a light source (e.g., a laser source) spaced apart from the image sensor by a predetermined distance, the triangulation method may sense light reflected from a target object, and may calculate the distance between the target object and the image sensor using the sensing result. After light has been emitted from the light source to the target object, the TOF method may measure a time duration in which light is reflected from the target object and returns to the image sensor, such that the TOF method may calculate the distance between the target object and the image sensor using the measurement result.

SUMMARY

Various embodiments of the disclosed technology relate to an image sensing device for increasing use efficiency of light.

In accordance with an embodiment of the disclosed technology, an image sensing device may include a semiconductor substrate including a first surface and a second surface opposite to the first surface, and configured to include a photoelectric conversion element that generates photocharges in response to light incident to the photoelectric conversion element via the first surface, and a lens layer disposed over the semiconductor substrate to direct light through first surface of the semiconductor substrate into the substrate lens which further directs the incident light into the photoelectric conversion element. The semiconductor substrate is structured to include a substrate lens formed by etching the first surface to a predetermined depth and located between the first surface and the photoelectric conversion element to direct incident light via the first surface to the photoelectric conversion element.

In accordance with another embodiment of the disclosed technology, an image sensing device may include a photoelectric conversion element disposed in a semiconductor substrate, and configured to perform photoelectric conversion of light incident upon the photoelectric conversion element, a substrate lens in the semiconductor substrate disposed over the photoelectric conversion element, and configured to allow incident light to converge upon the photoelectric conversion element, and a lens layer disposed over the semiconductor substrate and configured to direct the incident light to the substrate lens which further directs the incident light to the photoelectric conversion element.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides various implementations of an image sensing device which can allow incident light to converge upon a photoelectric conversion element, resulting in increased use efficiency of light.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
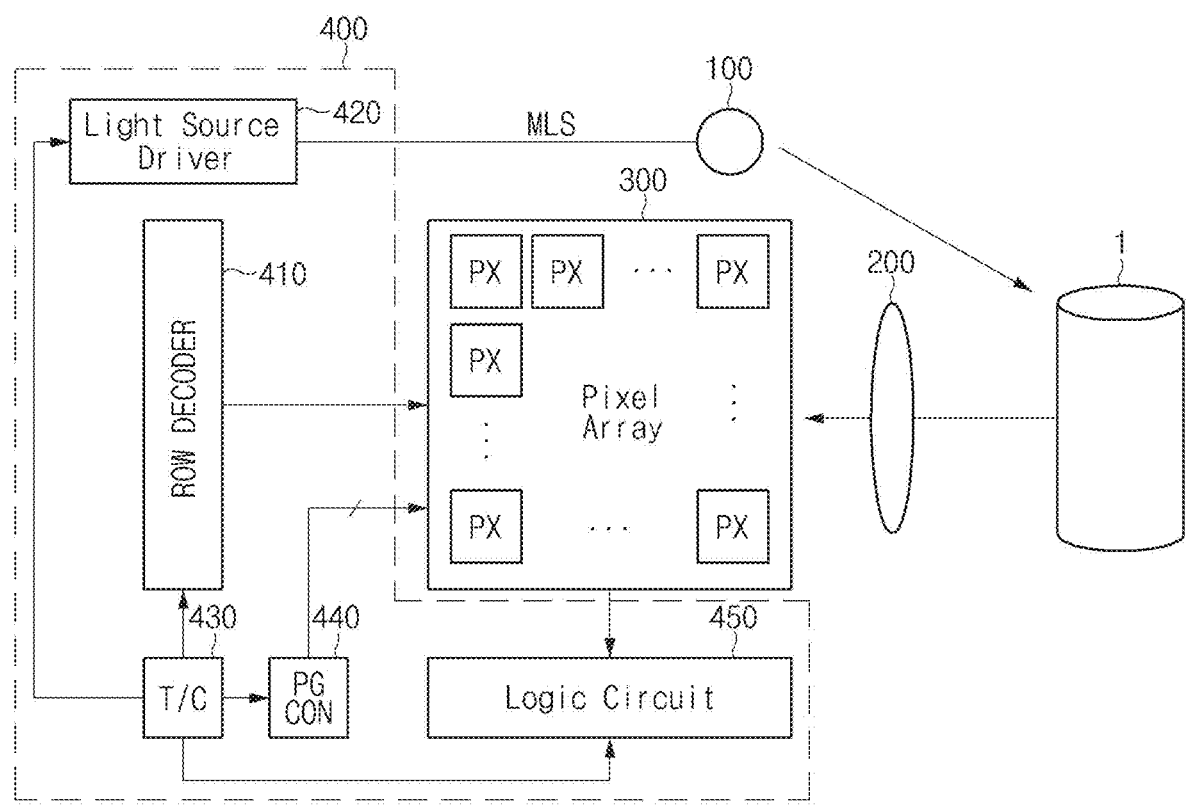
FIG. 1 is a block diagram illustrating an example of an image sensing device based on some implementations of the disclosed technology.

FIG. 1 is a block diagram illustrating an example of an image sensing device based on some implementations of the disclosed technology.

Referring to FIG. 1, the image sensing device may measure the distance by directing light to object and using the Time of Flight (TOF) principle. The image sensing device may include a light source 100, a lens module 200, a pixel array 300, and a control circuit 400.

The light source 100 may emit light to a target object 1 upon receiving a clock signal MLS from the control circuit 400. The light source 100 may be a laser diode (LD) or a light emitting diode (LED) for emitting infrared light or visible light, or may be any one of a Near Infrared Laser (NIR), a point light source, a monochromatic light source combined with a white lamp or a monochromator, and/or a combination of other laser sources. For example, the light source 100 may emit infrared light having a wavelength of 800 nm to 1000 nm. Although FIG. 1 shows only one light source 100 for convenience of description, the scope or spirit of the disclosed technology is not limited thereto, and a plurality of light sources may also be arranged in the vicinity of the lens module 200.

The lens module 200 may collect light reflected from the target object 1, and may allow the collected light to be focused onto pixels (PXs) of the pixel array 300. The lens module 200 may include a focusing lens having a surface formed of glass or plastic or another cylindrical optical element having a surface formed of glass or plastic. The lens module 200 may include a focusing lens having a convex structure.

The pixel array 300 may include unit pixels (PXs) consecutively arranged in a two-dimensional (2D) structure in which unit pixels are arranged in a column direction and a row direction perpendicular to the column direction. The unit pixels (PXs) may be formed in a semiconductor substrate, and each unit pixel (PX) may convert light received through the lens module 200 into an electrical signal corresponding to the received light such that each unit pixel can output a pixel signal. In this case, the pixel signal may be a signal for indicating the distance to the target object 1, instead of indicating a signal indicating a color of the target object 1. The pixel array 300 may include a substrate lens that is formed by etching the semiconductor substrate to a predetermined depth. Each unit pixel (PX) may be a Current-Assisted Photonic Demodulator (CAPD) pixel for detecting electrons (signal carriers) generated in the semiconductor substrate by incident light using a difference between potential levels of an electric field.

The control circuit 400 may emit light to the target object 1 by controlling the light source 100, may process each pixel signal corresponding to light reflected from the target object 1 by driving unit pixels (PXs) of the pixel array 300, and may measure the distance to the surface of the target object 1.

The control circuit 400 may include a row decoder 410, a light source driver 420, a timing controller 430, a photogate controller 440, and a logic circuit 450.

The row decoder 410 may drive unit pixels (PXs) of the pixel array 300 in response to a timing signal generated from the timing controller 430. For example, the row decoder 410 may generate a control signal capable of selecting at least one of the plurality of row lines. The control signal may include a selection signal for controlling the selection transistor and a transmission (Tx) signal for controlling transfer gates.

The light source driver 420 may generate a clock signal MLS capable of driving the light source 100 in response to a control signal from the timing controller 430. The light source driver 420 may supply either the clock signal MLS or information about the clock signal MLS to the photogate controller 440.

The timing controller 430 may generate a timing signal to control the row decoder 410, the light source driver 420, the photogate controller 440, and the logic circuit 450.

The photogate controller 440 may generate photogate control signals in response to a control signal of the timing controller 430, and may supply the photogate control signals to the pixel array 300. Although FIG. 1 illustrates only the photogate controller 440 for convenience of description, the control circuit 400 may include a photodiode controller that generates a plurality of photodiode control signals in response to a control signal of the timing controller 430 and then transmits the photodiode control signals to the pixel array 300.

The logic circuit 450 may process pixel signals received from the pixel array 300 under control of the timing controller 430, and may thus calculate the distance to the target object 1. The logic circuit 450 may include a correlated double sampler (CDS) circuit for performing correlated double sampling (CDS) on the pixel signals generated from the pixel array 300. In addition, the logic circuit 450 may include an analog-to-digital converter (ADC) for converting output signals of the CDS circuit into digital signals.

Figure 2:
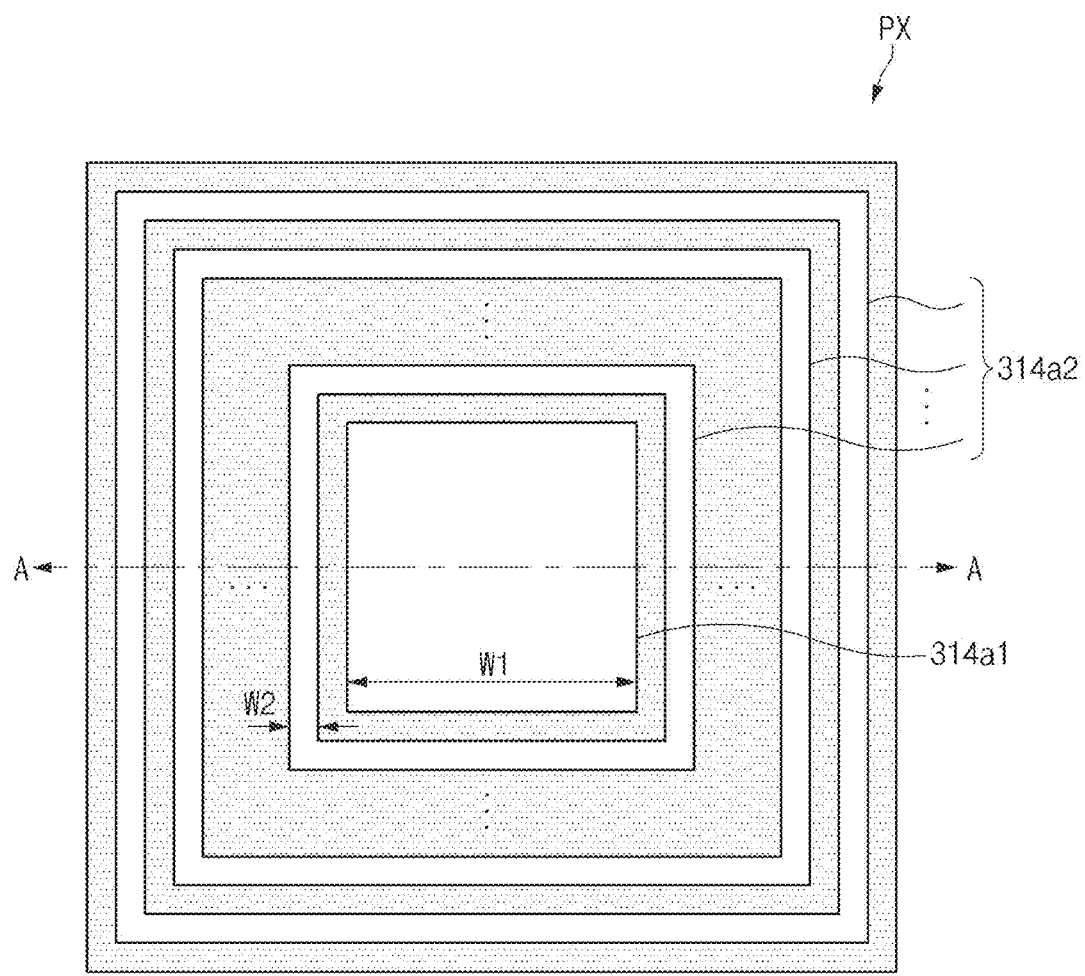
FIG. 2 is a view illustrating one example of a substrate lens formed in any one of unit pixel regions in a pixel array shown in FIG. 1 based on some implementations of the disclosed technology.
Figure 3:
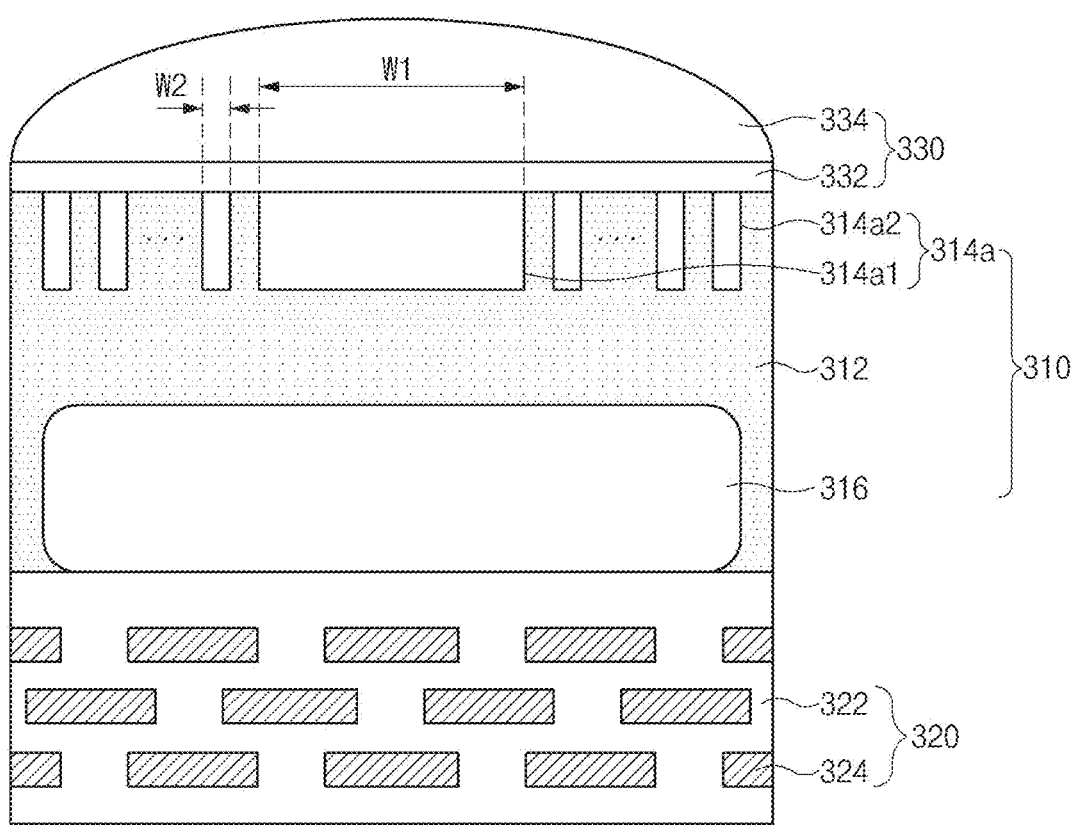
FIG. 3 is a cross-sectional view illustrating one example of a unit pixel structure taken along the line A-A' shown in FIG. 2 based on some implementations of the disclosed technology.

FIG. 2 illustrates one example of a substrate lens formed in any one of unit pixel regions in a pixel array shown in FIG. 1 based on some implementations of the disclosed technology. FIG. 3 is a cross-sectional view illustrating appearance of one example of the unit pixel structure taken along the line A-A' shown in FIG. 2 based on some implementations of the disclosed technology.

Referring to FIGS. 2 and 3, each unit pixel (PX) may include a substrate layer 310 and a line layer 320. The line layer 320 can correspond to an interconnect layer.

The substrate layer 310 may include a substrate lens 314a formed in a substrate 312 and a photoelectric conversion element 316 also formed in the substrate 312. Light incident to the photoelectric conversion element 316 first passes through the substrate lens 314a and then reaches the photoelectric conversion element 316.

The substrate 312 may include a semiconductor substrate that includes a first surface and a second surface facing the first surface and opposite to the first surface. The semiconductor substrate may be in a monocrystalline state, and may include a silicon-containing material. For example, the substrate 312 may include a monocrystalline silicon-containing material.

The substrate lens 314a may be formed at or around the first surface of the substrate 312 such that the substrate lens 314a is disposed closer to the first surface than the second surface of the substrate 312, and the line layer 320 may be formed over the second surface of the substrate 312 such that the line layer 320 is disposed closer to the second surface than the first surface of the substrate 312. In some implementations, the unit pixel (PX) may be constructed as a Current-Assisted Photonic Demodulator (CAPD) pixel having a control region and a detection region that are coupled to metal lines 324 of the line layer 320 and formed at the second surface of the substrate 312. In such a CAPD pixel design, the control region may generate a plurality of carrier currents in the substrate 312 based on a voltage received through one or more metal lines 324. When electrons generated by light incident upon the substrate 312 are moving by the plurality of carrier currents, the detection region may capture the moving electrons. The control region may include a P-type impurity region, and the detection region may include an N-type impurity region.

The substrate lens 314a may allow or help incident light to more easily converge upon the photoelectric conversion element 316 of the substrate 312. In this case, the incident light may be infrared light (IR) having a longer wavelength than visible light. In addition, as further explained below, the substrate lens 314a may be structured to allow the incident light to be totally reflected therein so that the length of light proceeding paths can be increased and thus light having a long wavelength can be well converged into the photoelectric conversion element 316.

The substrate lens 314a may include a first trench lens 314a1 at or near the center of the substrate lens 314a by removing the substrate material and being filled by a gapfill material and a plurality of second trench lenses 314a2 outside the first trench lens 314a1. As shown in FIGS. 2 and 3, first and second trench lenses 314a2 are separated and surrounded by walls of the substrate material.

The first trench lens 314a1 may be located at or around the center part of the first surface of the substrate 312 and formed by etching the substrate 312 from the first surface to a predetermined depth, and may include a gapfilled structure in which a material (e.g., an oxide film) having a refractive index different from that of the substrate 312 is formed or disposed in the trench. In implementations, the gapfill material is selected so that there is a large or substantial difference in refractive index between the above gapfill material and the substrate material of the substrate 312. For example, the gapfill material in the first trench lens 314a1 may include material having a higher refractive index than the substrate 312 by "1" or greater.

The first trench lens 314a1 may be formed to have a width W1 (or a larger region) larger than that W2 of the second trench lenses 314a2. A plane view of the first trench lens 314a1 may have a polygonal shape, for example, a rectangular shape, a hexagonal shape, an octagonal shape, etc.

The second trench lenses 314a2 may be formed to surround the first trench lens 314a1 at the first surface of the substrate 312, and may include a specific structure in which a material (e.g., an oxide film) having a different refractive index from that of the substrate 312 is formed to fill or gapfill the trench formed by etching the first surface of the substrate 312 to a predetermined depth. In this case, the gapfill material may be a material greatly or substantially different in refractive index from the substrate 312 in the same manner as in the first trench lens 314a1. For example, the gapfill material for use in each of the second trench lenses 314a2 may be identical to the gapfill material for use in the first trench lens 314a1.

Figure 4:
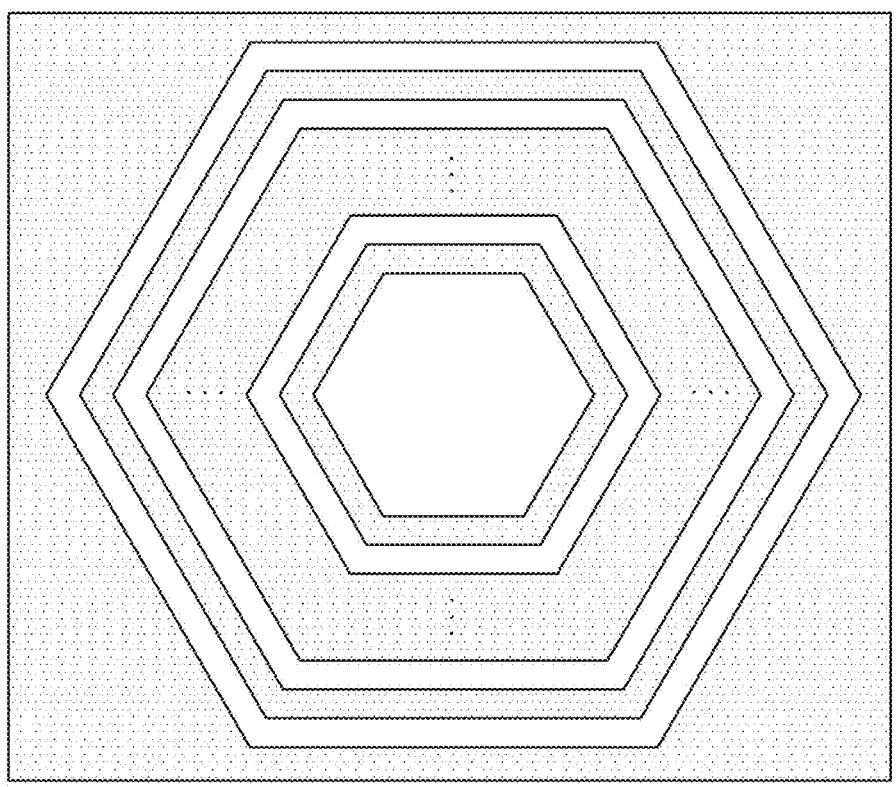
FIG. 4 is a view illustrating another example of the substrate lens formed in any one of unit pixel regions in the pixel array shown in FIG. 1 based on some implementations of the disclosed technology.

Each of the second trench lenses 314a2 may be formed in a band shape surrounding the first trench lens 314a1 as shown in FIG. 2. In this case, the band shape of the second trench lenses 314a12 may be changed according to the shape of the first trench lens 314a1. For example, if the plane view of the first trench lens 314a1 is formed in a square shape as shown in FIG. 2, each of the second trench lenses 314a2 may be formed in a square band shape. In another example, if the horizontal cross-sectional view of the first trench lens 314a1 is formed in a hexagonal shape as shown in FIG. 4, each of the second trench lenses 314a2 may be formed in a hexagonal band shape.

Each of the second trench lenses 314a2 may be formed to have a small width W2, such that the second trench lenses 314a2 may induce total internal reflection of incident lights applied to each of the second trench lenses 314a2. For example, the width W2 of each trench lens 314a2 may be adjusted such that incident light applied to the second trench lenses 314a2 are consecutively reflected from boundary surfaces of both sides of each second trench lens 314a2 and proceed in a downward direction. As described above, the second trench lenses 314a2 may induce total internal reflection of incident lights to increase the length of light proceeding paths. As a result, even when light having a long wavelength is incident upon the pixel array, the corresponding light can be easily converged upon the photoelectric conversion element 316. In addition, since each of the second trench lenses 314a2 is adjusted in width and depth, a refraction angle of light having passed through the second trench lenses 314a2 is increased so that the resultant light can be more easily converged upon the photoelectric conversion element 316. In addition, since the distance (or interval) between the second trench lenses 314a2 is adjusted, total internal reflection of incident lights applied to the substrate region between the second trench lenses 314a2 can also be induced.

The second trench lenses 314a2 may be spaced apart from each other by a predetermined distance. Alternatively, the distance between the second trench lenses 314a2 may be changed according to the distance from each second trench lens 314a2 to the first trench lens 314a1. For example, the distance between the second trench lenses 314a2 may be increased in proportion to the distance from each second trench lens 314a2 to the first trench lens 314a1. In contrast, the distance between the second trench lenses 314a2 may be reduced in proportion to the increasing distance from each second trench lens 314a2 to the first trench lens 314a1.

The first trench lens 314a1 and each of the second trench lenses 314a2 may have the same depth. Alternatively, each of the second trench lenses 314a2 may be different in depth from the first trench lens 314a1. Alternatively, each of some trench lenses selected from among the second trench lenses 314a2 may have the same depth as the first trench lens 314a1, and each of the remaining trench lenses other than the selected trench lenses may be different in depth from the first trench lens 314a1. For example, only one trench lens located closest to the first trench lens 314a1 from among the second trench lenses 314a2 may have the same depth as the first trench lens 314a1, and each of the remaining trench lenses other than the only one trench lens may be different in depth from the first trench lens 314a1.

The second trench lenses 314a2 may have different depths according to the distance from each second trench lens 314a2 to the first trench lens 314a1. For example, as the distance from each second trench lens 314a2 to the first trench lens 314a1 is gradually increasing, the second trench lenses 314a2 may be gradually increased in depth. Alternatively, as the distance from each second trench lens 314a2 to the first trench lens 314a is gradually increasing, the second trench lenses 314a2 may be gradually reduced in depth.

The first trench lens 314a1 may have a different width from that of any of the second trench lenses 314a2. For example, the first trench lens 314a1 may be formed to have a larger width than each of the second trench lenses 314a2. The second trench lenses 314a2 may have the same width each other. Alternatively, the second trench lenses 314a2 may have different widths each other. For example, each of the second trench lenses 314a2 may be smaller in width than the first trench lens 314a1, and the second trench lenses 314a2 may have the same width each other. Alternatively, each second trench lens 314a2 may be smaller in width than the first trench lens 314a1, and the width of each second trench lens 314a2 may be gradually increased in proportion to the increasing distance from the second trench lens 314a2 to the first trench lens 314a1. In contrast, each of the second trench lenses 314a2 may have a smaller width than the first trench lens 314a1, and the width of each second trench lens 314a2 may be gradually reduced in proportion to the increasing distance from the second trench lens 314a2 to the first trench lens 314a1. The region of the first trench lens 314a1 may be larger in size than the region of each unit pixel (PX) by 40% or less.

The photoelectric conversion element 316 may be formed below the substrate lens 314a, and may generate photocharges by converting incident light received through the substrate lens 314a. The photoelectric conversion element 316 may include a specific structure in which different types of impurity regions are vertically stacked. For example, the photoelectric conversion element 316 may include a photodiode (PD) formed by vertically stacking the N-type impurity region and the P-type impurity region. The photoelectric conversion element 316 may generate electron-hole pairs in response to light incident received through the substrate lens 314a.

The line layer 320 may be formed over the second surface of the substrate 312. The line layer 320 may include interlayer insulation layers 322, and may further include metal lines 324 that are stacked as a plurality of layers in the interlayer insulation layers 322. Each of the interlayer insulation layers 322 may include at least one of an oxide film or a nitride film. Each of the metal lines 324 may include at least one of aluminum (Al), copper (Cu), or tungsten (W). The metal lines 324 may include a plurality of lines configured to transmit electrical signals (e.g., pixel signals) generated in the photoelectric conversion element 316 and a plurality of signals (voltages) needed to generate such pixel signals. The metal lines 324 may be coupled to the control region and the detection region that are formed over the second surface of the substrate 312.

A lens layer 330 for allowing light reflected from the target object 1 to converge upon the substrate lens 314a may be formed over the substrate lens 314a. The lens layer 330 may include an anti-reflection film 332 and a microlens 334.

Figure 5:
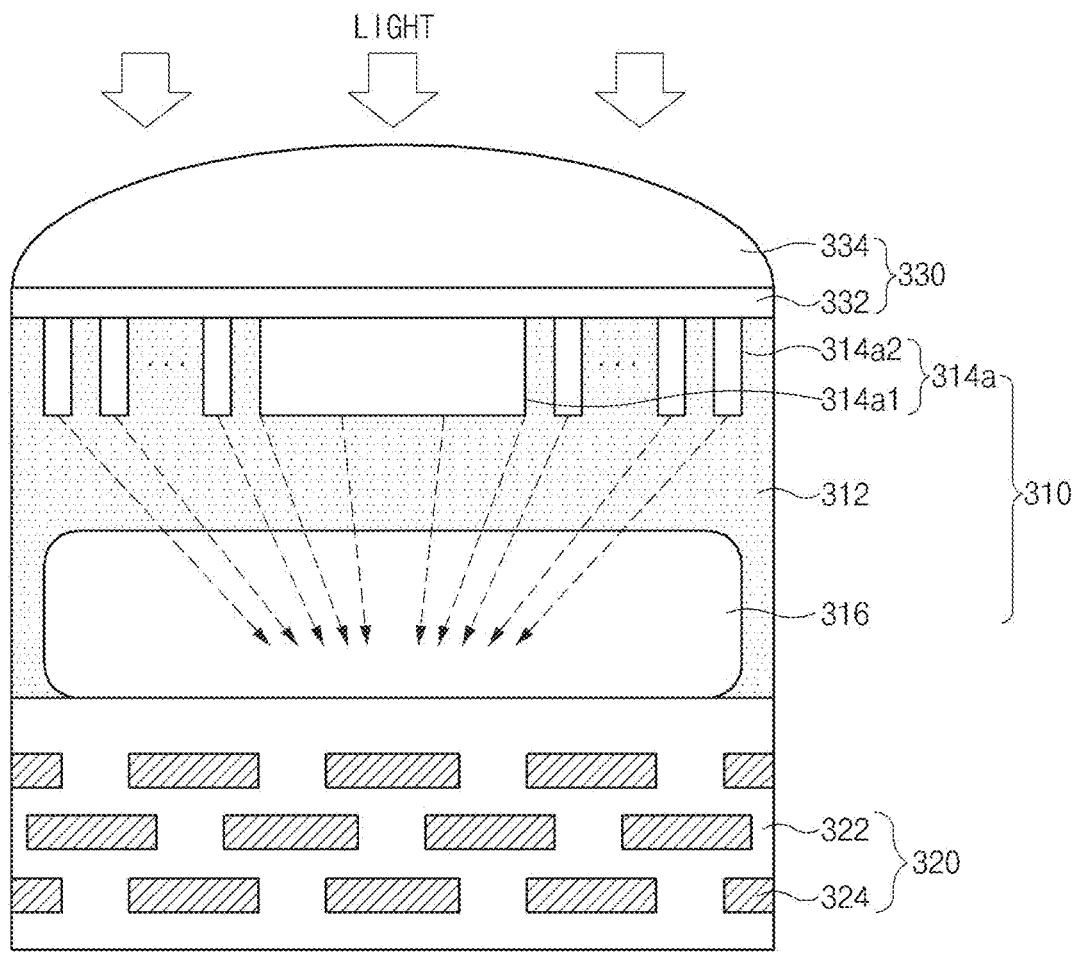
FIG. 5 is a cross-sectional view illustrating one example of a unit pixel region in which light converges upon a photoelectric conversion element through a substrate lens shown in FIG. 3 based on some implementations of the disclosed technology.
Figure 6A:
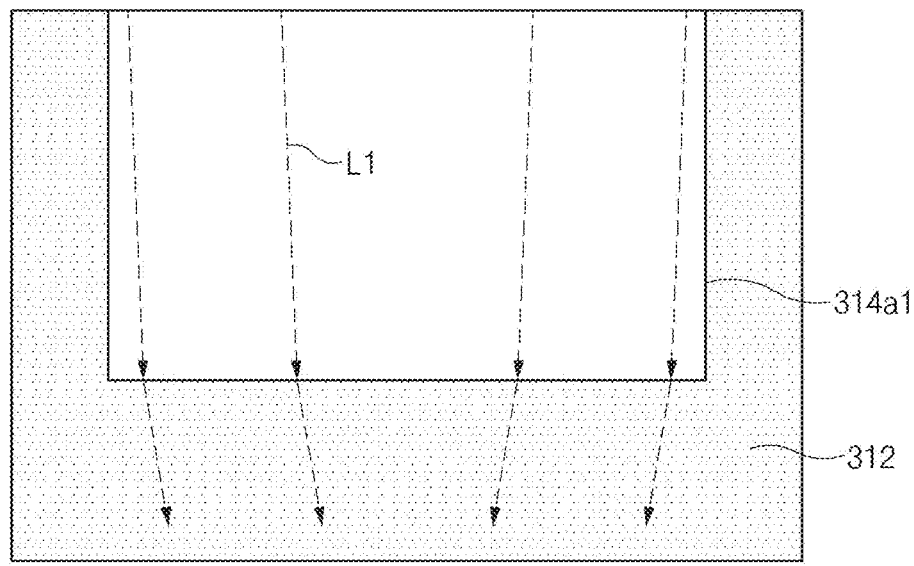
FIG. 6A is an example of a diagram illustrating a light proceeding in a first trench lens shown in FIG. 5 based on some implementations of the disclosed technology.
Figure 6B:
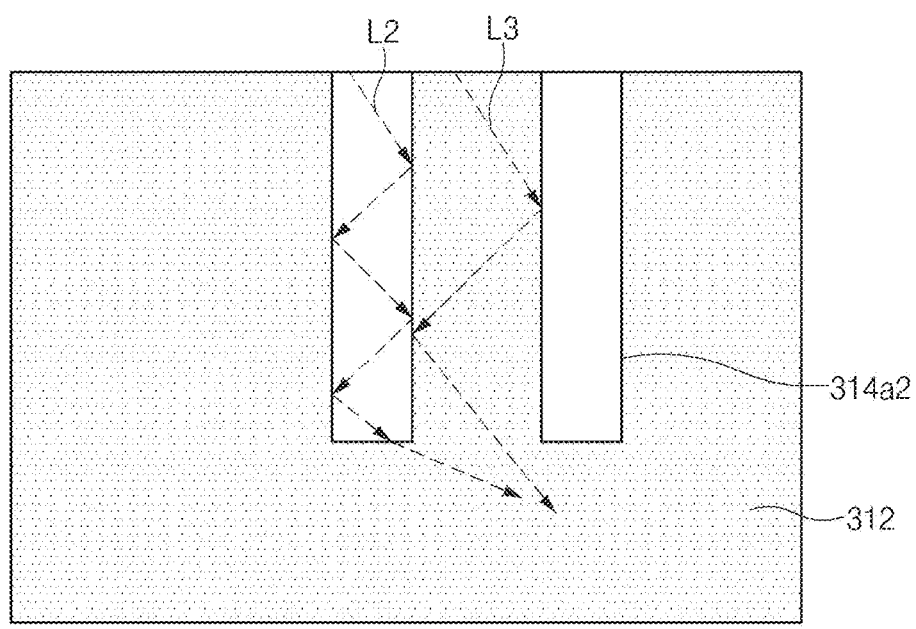
FIG. 6B is an example of a diagram illustrating lights proceeding in a second trench lens and between second trench lenses based on some implementations of the disclosed technology.

FIG. 5 is a cross-sectional view illustrating one example of a unit pixel region in which light converges upon a photoelectric conversion element through a substrate lens shown in FIG. 3 based on some implementations of the disclosed technology. FIG. 6A is an example of a diagram illustrating light proceeding in the first trench lens 314a1 shown in FIG. 5 based on some implementations of the disclosed technology. FIG. 6B is an example of a diagram illustrating light proceeding in the second trench lens 314a2 and between the second trench lenses 314a2 based on some implementations of the disclosed technology.

Referring to FIGS. 5 and 6A, the first trench lens 314a1 may be formed to have a larger width than that of the second trench lens 314a2 and may be located at or around the center part of the unit pixel (PX). Due to its central location of the first trench lens 314 a1, lights (L1) incident upon the first trench lens 314a1 may have a relatively small incident angles with regard to a normal line perpendicular to a bottom surface of the first trench lens 314a1 and thus, most parts of the lights (L1) incident upon the first trench lens 314a1 may directly proceed to the photoelectric conversion element 316 through the bottom surface of the first trench lens 314a1 without meeting a boundary located at a side surface of the first trench lens 314a1. In addition, since each of the lights (L1) incident upon the first trench lens 314a1 has a small angle of incidence, each of the lights (L1) may also have a small refraction angle.

As a result, most parts of the lights (L1) having passed through the first trench lens 314a1 may converge upon the photoelectric conversion element 316 without escaping from the photoelectric conversion element 316.

Lights applied to the unit pixel (PX) are incident upon the first trench lens 314a1 by the light converging (or light focusing) effect provided by the lens layer 330. The first trench lens 314a1 has a relatively large width, which makes total light incident upon the first trench lens 314a1 more increase and thus the efficiency for collecting light by the first trench lens 314a1 is considerably high.

Generally, light tends to be more easily reflected from a place/structure in which patterns are densely formed. In some implementations, the trench lenses 314a1 and 314a2 are formed to have different patterns. For example, the second trench lenses 314a2 are densely formed to have the same pattern with a certain width and the first trench lens 314a1 is formed to have a width larger than that of the second trench lenses 314a2. Thus, as compared to the area where the first trench lens 314a1 is formed, light is more easily reflected from a region where the second trench lenses 314a2 are formed. Thus, incident light to be applied to the first trench lens 314a1 can be more easily introduced into the trench.

Referring to FIGS. 5 and 6B, each of the second trench lenses 314a2 may be formed to have a relatively small width. Each second trench lens 314a2 may be located outside the first trench lens 314a1 which is located around the center part of the substrate 312. The second trench lens 314a2 may be disposed outer part of the first trench lens 314a1. Thus, the incident angles of multiple lights (L2) incident upon the second trench lenses 314a2 may be relatively increased as compared to those of the lights L1 incident upon the first trench lens 314a1. As shown in FIG. 6B, some or most parts of the lights (L2) incident upon the second trench lenses 314a2 may pass and meet boundary surfaces located at the side surfaces of the second trench lenses 314a2.

Some of the lights (L2) incident upon the second trench lenses 314a2 may be consecutively reflected through the total internal reflection from boundary surfaces of both sides of the second trench lenses 314a2 and can be directed to the bottom surface of each of the second trench lenses 314a2. In this case, if the incident angle of light incident upon a bottom surface of each of the second trench lenses 314a2 is increased, the refraction angle at the bottom boundary is also increased, such that multiple lights (L2) having passed through the second trench lenses 314a2 may be directed to the center part of the photoelectric conversion element 316.

In various implementations, the width of each second trench lens 314a2, the gapfill material to be used in the second trench lens 314a2, and the depth of the second trench lens 314a2 may be adjusted to increase efficiency for collecting light by the second trench lens 314a2. The light collection efficiency can increase when most lights (L2) having passed through the second trench lenses 314a2 are refracted (or bent) with a relatively large angle and the resultant refracted lights (L2) are directed to the center part of the photoelectric conversion element 316.

A gap (or space) between the second trench lenses 314a2 may be filled with the same materials as those of the substrate 312, such that light may not be refracted at the bottom surface in the same manner as in the second trench lenses 314a2. However, each light (L3) incident upon a region (or space) between the second trench lenses 314a2 may be reflected from boundary surfaces between the second trench lenses 314a2 located at both sides of each light (L3). Thus, proceeding paths of lights (L3) may be increased.

The regions disposed between the second trench lenses 314a2 can allow the incident lights (L3) to converge upon the photoelectric conversion element 316 through total internal reflection. In this case, the light converging effect obtained from the regions disposed between the second trench lenses 314a2 to converge light upon the center part of the photoelectric conversion element 316 may be lower than the light converging effect obtained from the second trench lenses 314a2. However, the region disposed between the second trench lenses 314a2 can increase proceeding paths of the incident lights (L3) such that lights each having a long wavelength can be easily collected in the photoelectric conversion element 316.

Figure 7:
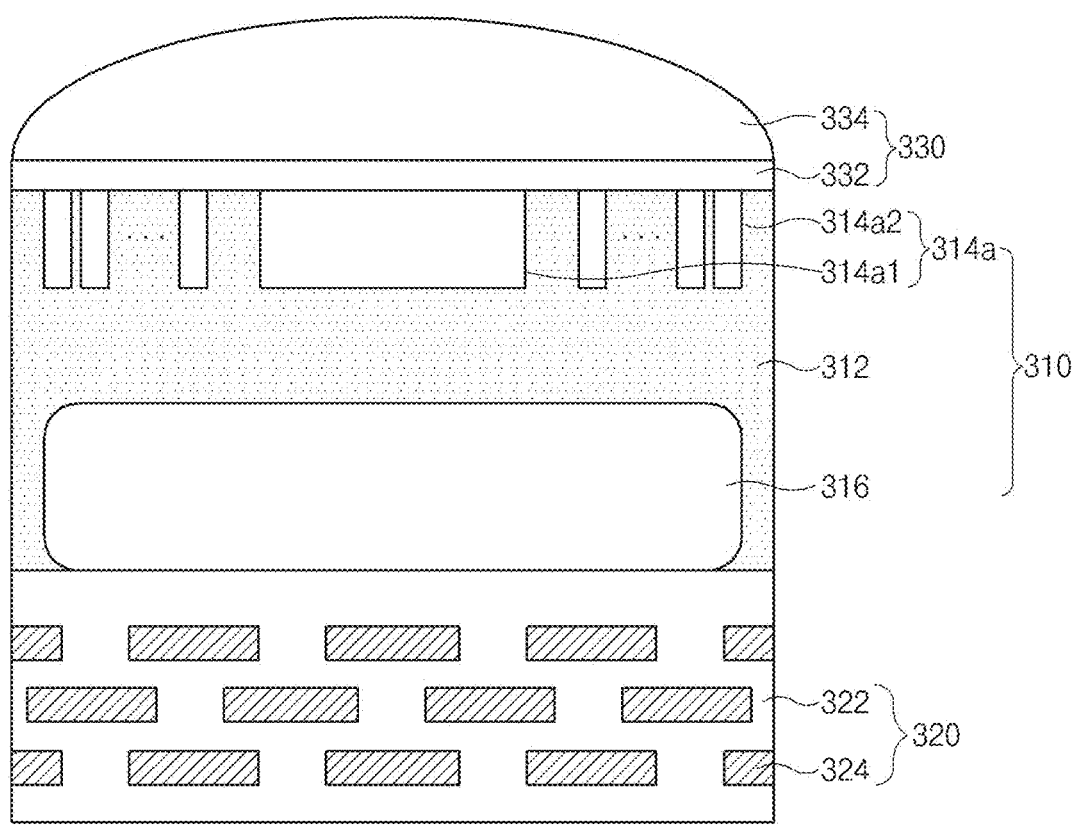
FIG. 7 is a cross-sectional view illustrating another example of the unit pixel structure taken along the line A-A' shown in FIG. 2 based on some implementations of the disclosed technology.
Figure 8:
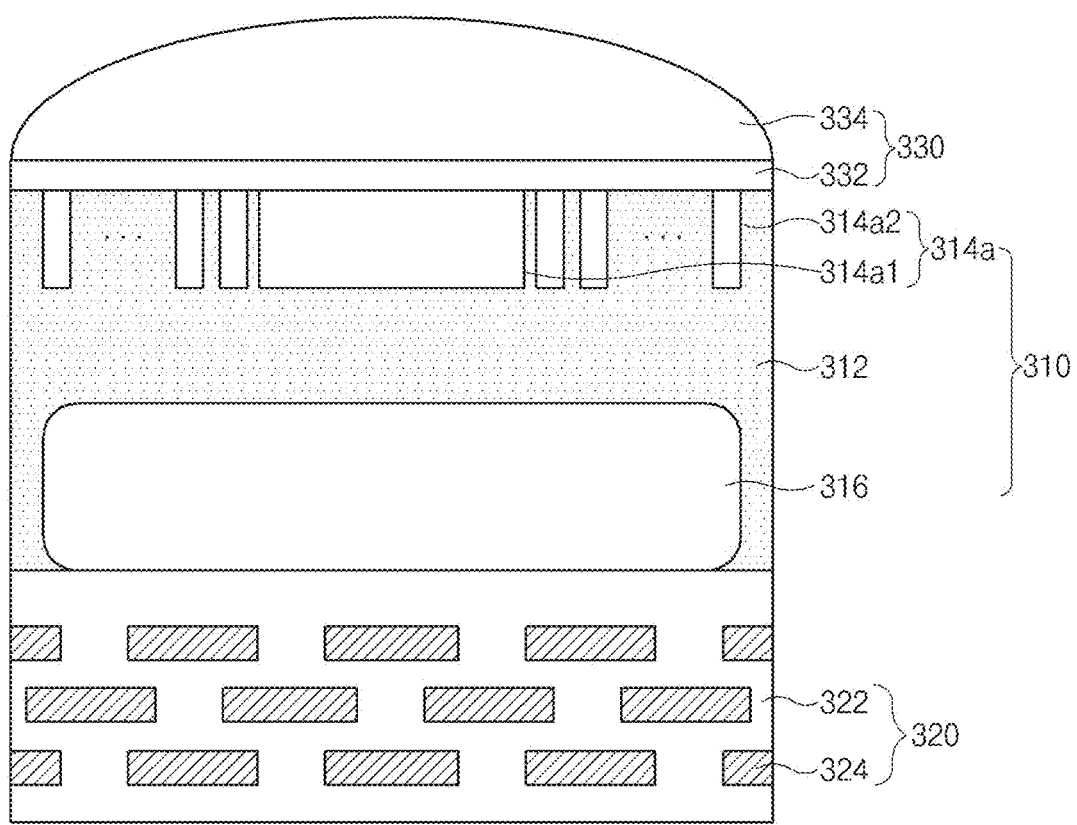
FIG. 8 is a cross-sectional view illustrating another example of the unit pixel structure taken along the line A-A' shown in FIG. 2 based on some implementations of the disclosed technology.

FIG. 7 is a cross-sectional view illustrating another example of a unit pixel structure taken along the line A-A' shown in FIG. 2. FIG. 8 is a cross-sectional view illustrating another example of a unit pixel structure taken along the line A-A' shown in FIG. 2, where the unit pixel structure has a cross-sectional view as shown in FIG. 7.

Referring to FIGS. 7 and 8, the width of the space between any two adjacent ones of the trench lenses 314a1 and 314a2 may be changed based the distance between the first trench lens 314a1 and each of the second trench lenses 314a2.

For example, as can be seen from FIG. 7, as the distance from the first trench lens 314a1 is gradually increased, the width of the space between the trench lenses 314a2 may be gradually reduced. Alternatively, as can be seen from FIG. 8, as the distance from the first trench lens 314a1 is gradually increased, the width of the space between the second trench lenses 314a2 may be gradually increased.

In a region located relatively closer to the first trench lens 314a1 in the pixel structure shown in FIG. 7, the light converging effect induced by the second trench lenses 314a2 may be higher than the light converging effect obtained from the space between the second trench lenses 314a2. For example, if the space between the second trench lenses 314a2 is formed to have a relatively large width, a relatively less reflections of lights (L3) may be generated as compared to a case in which the space between the second trench lenses 314a2 is formed to have a relatively smaller width. Therefore, the light converging effect caused by the second trench lenses 314a2 may be mainly generated in the region located closer to the first trench lens 314a1.

In another region located relatively far from the first trench lens 314a1, there are increased light proceeding paths toward the photoelectric conversion element 316. For example, light is converged upon the photoelectric conversion element 316 by the converging effect caused by the second trench lenses 314a2. In addition, total internal reflection may also occur in the region between the second trench lenses 314a2 such that light can be converged upon the photoelectric conversion element 316. For example, if the space between the second trench lenses 314a2 is formed to have a relatively small width, a relatively many reflections of lights (L3) may be generated in the substrate region between the second trench lenses 314a2 as compared to the case in which the space between the second trench lenses 314a2 is formed to have a relatively large width. The more reflections of lights L3 are caused in the space between the second trench lenses 314a2, the more light proceeding paths can be converge upon the photoelectric conversion element 316. Therefore, in the implementation as shown in FIG. 7, in the region located further from the first trench lens 314a1 and having second trench lenses 314a2 arranged with a relatively smaller width therebetween, the effect of increasing the length of light proceeding paths that have passed through the substrate region between the second trench lenses 314a2 and are converged upon the photoelectric conversion element 316 can be more strengthened.

In the implementation as shown in FIG. 8, in the region located adjacent or relatively closer to the first trench lens 314a1, the space between the second trench lenses 314a2 is formed to have a relatively smaller width as compared to that of the space between the second trench lenses 314a2 located further form the first trench lens 314a1. Thus, in the implementation in FIG. 8, the light converging effect caused by the second trench lenses 314a2 and the additional effect due to the increased light proceeding paths caused by total internal reflection generated in the region interposed between the second trench lenses 314a2 can be obtained in the region located adjacent or relatively closer to the first trench lens 314 a1.

As already discussed above, in the region located further from the first trench lens 314a1, the light converging effect caused by the second trench lenses 314a2 may be higher than the light converging effect caused by the light passing through the space interposed between the second trench lenses 314a2.

Figure 9:
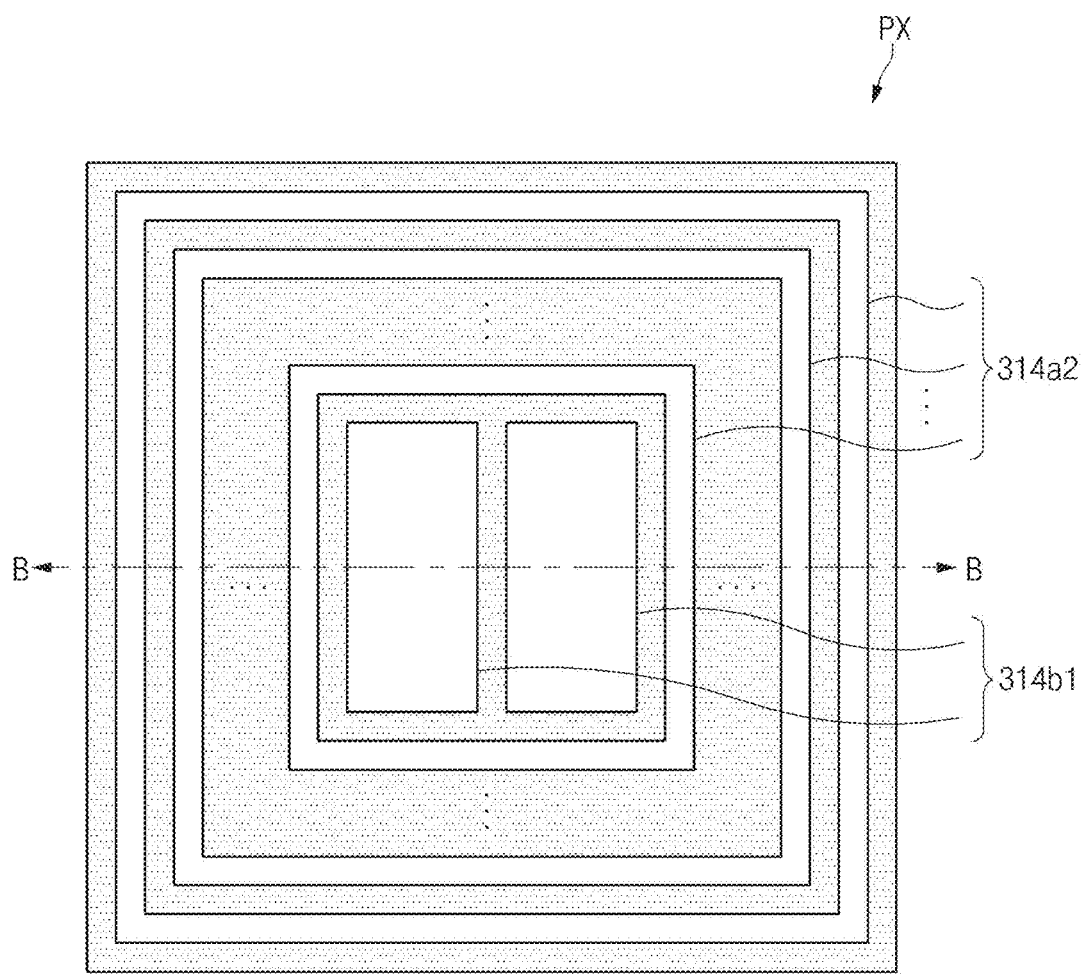
FIG. 9 is a view illustrating another example of a substrate lens formed in any one of unit pixel regions in the pixel array shown in FIG. 1 based on some implementations of the disclosed technology.
Figure 10:
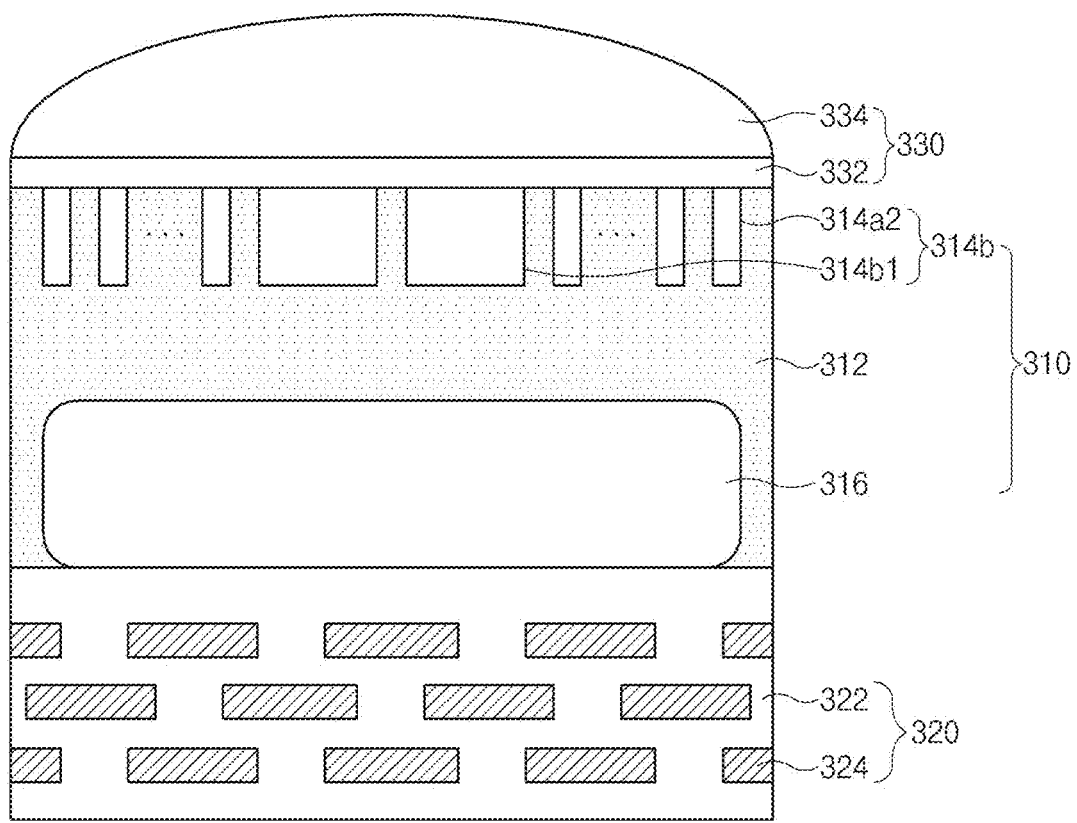
FIG. 10 is a cross-sectional view illustrating one example of the unit pixel structure taken along the line B-B' shown in FIG. 9 based on some implementations of the disclosed technology.

FIG. 9 is a cross-sectional view illustrating another example of a substrate lens formed in any one of unit pixel regions in the pixel array shown in FIG. 1 based on some implementations of the disclosed technology. FIG. 10 is a cross-sectional view illustrating one example of the unit pixel structure taken along the line B-B' shown in FIG. 9 based on some implementations of the disclosed technology.

Referring to FIGS. 9 and 10, the substrate lens 314b may include a plurality of first trench lenses 314b1 and a plurality of second trench lenses 314a2.

The first trench lenses 314b1 may be spaced apart from each other by a predetermined distance at or around the center part of the first surface of the substrate 312, and may also be arranged symmetrical to each other with respect to the center part of the first surface of the substrate. Unlike the implementations as shown in FIGS. 2 to 8 in which a single trench lens 314a1 having a relatively large width is formed at or around the center part of the unit pixel (PX), in the present implementation, the plurality of first trench lenses 314b1 each having a relatively large width may be formed at or around the center part of the unit pixel (PX). Although FIG. 9 illustrates the example in which two first trench lenses 314b1 are formed as an example of the disclosed technology, the number of the first trench lenses 314b1 is not limited to two and can be any other number than two.

By adjusting the distance between the first trench lenses 314b1, total internal reflection of lights that are incident upon the region between the first trench lenses 314b1 can occur. Thus, it is possible to allow lights to be converged upon the photo photoelectric conversion element 316 by using the light converging effect caused both by the light passing through the first trench lenses 314b1 and total internal reflection of light passing through the region between the first trench lenses 314b1.

Although FIG. 9 has disclosed the exemplary case in which the second trench lenses 314a2 are spaced apart from each other at a same interval, the disclosed technology is not limited thereto. Thus, the distance between the second trench lenses 314a2 can also be changed according to the distance between the first trench lens 314b1 and each of the second trench lenses 314a2 as shown in FIGS. 7 and 8.

A top surface of each of the gapfill material films formed to gapfill the trench lenses 314b1 and 314a2 may be more protruded than the top surface of the substrate 312, or the top surface of each gapfill material film may be disposed below the top surface of the substrate 312.

Figure 11:
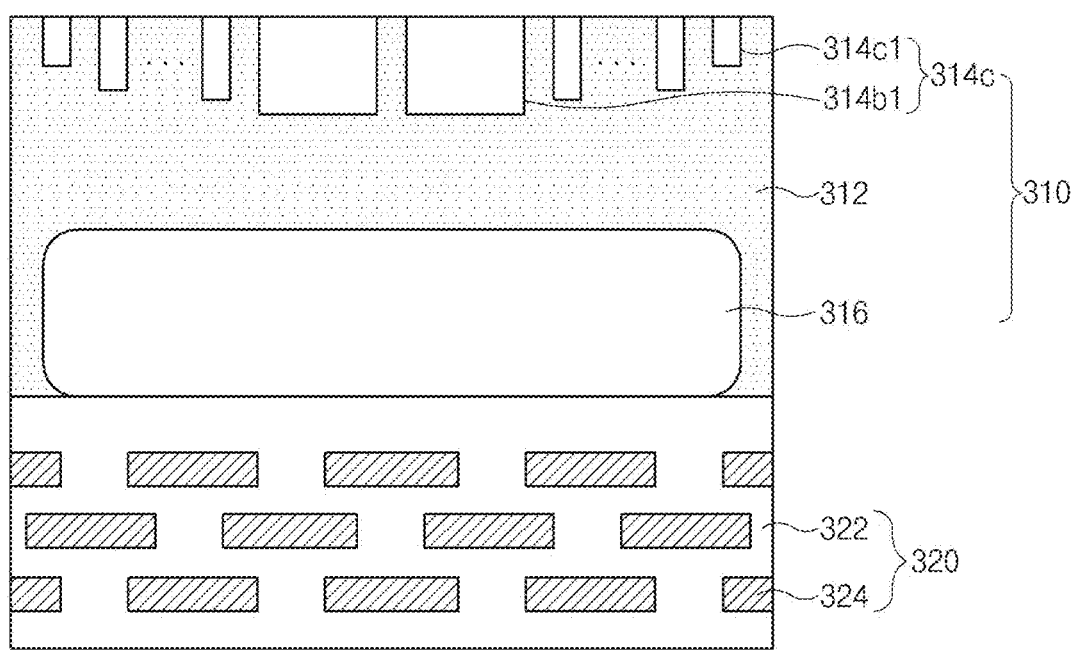
FIG. 11 is a cross-sectional view illustrating another example of the unit pixel structure taken along the line B-B' shown in FIG. 9 based on some implementations of the disclosed technology.

FIG. 11 is a cross-sectional view illustrating another example of a unit pixel structure taken along the line B-B' shown in FIG. 9 based on some implementations of the disclosed technology.

Referring to FIG. 11, the substrate lens 314c may include a plurality of first trench lenses 314b1 and a plurality of second trench lenses 314c1.

Unlike the pixel structure shown in FIG. 10, the second trench lenses 314c1 may be formed to have different widths and different depths according to the distance to the first trench lens 314b1. For example, the second trench lenses 314c1 may be gradually reduced in width and depth in proportion to the increasing distance to the first trench lens 314b1. Alternatively, as the distance to the first trench lens 314b1 is gradually increasing, the second trench lenses 314c1 may be gradually increased in width and depth.

In some implementations, not only the widths of the trench lenses 314c1 and 314b1, but also the refractive indexes of the gapfill materials configured to gapfill the trench lenses 314c1 and 314b1 may be adjusted, such that the light converging effect caused by multiple lights passing through the substrate lens 314c can be more strengthened. Alternatively, the lens layer 330 may not be formed over the substrate lens 314c as necessary.

Figure 12:
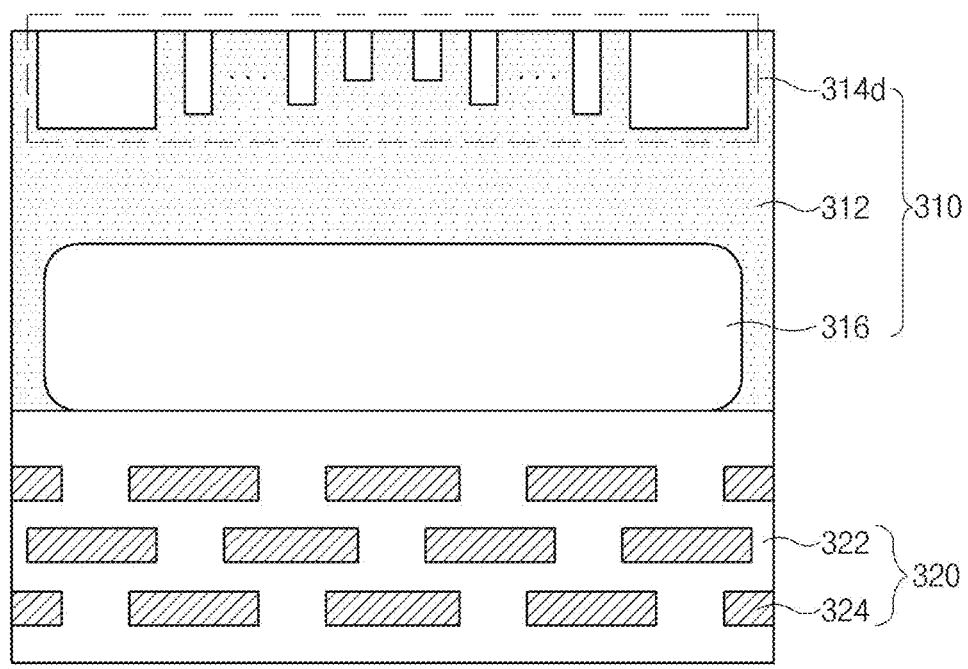
FIG. 12 is a cross-sectional view illustrating another example of a unit pixel based on implementations of the disclosed technology.

FIG. 12 is a cross-sectional view illustrating another example of the unit pixel based on implementations of the disclosed technology.

Referring to FIG. 12, the substrate lens 314d may include a plurality of trench lenses. In this case, the trench lenses may be formed in a shape in which the trench lenses are gradually increased in width and depth as the distance from the center part of each unit pixel to the edge region of the unit pixel is gradually increased. In some implementations, the trench lenses may be spaced apart from each other at intervals of the same distance.

In the substrate lens 314d, a trench lens having a large width may not be formed at the center part of the substrate lens 314d unlike the above-mentioned embodiments of the disclosed technology.

In the above-mentioned structure, the widths of the trench lenses and the refractive indexes of the gapfill materials for use in the trench lenses may be adjusted, such that the light converging effect caused by multiple lights passing through the substrate lens 314d can be increased. In some implementations, the lens layer 330 may not be formed over the substrate lens 314d.

As is apparent from the above description, the image sensing device according to the embodiments of the disclosed technology can allow incident light to converge upon a photoelectric conversion element, resulting in increased use efficiency of light.

Only a few examples and implementations are disclosed. Variations, modifications, and enhancements to the described examples and implementations and other implementations can be made based on what is disclosed.

What is claimed is:

1. An image sensing device comprising:
   a semiconductor substrate including a first surface and a second surface opposite to the first surface and configured to include a photoelectric conversion element that generates photocharges in response to light incident to the photoelectric conversion element via the first surface, wherein the semiconductor substrate is structured to include a substrate lens formed by etching the first surface to a predetermined depth and located between the first surface and the photoelectric conversion element to direct incident light via the first surface to the photoelectric conversion element; and
   a lens layer disposed over the semiconductor substrate to direct light through the first surface of the semiconductor substrate into the substrate lens which further directs the incident light into the photoelectric conversion element, and
   wherein a top surface of the substrate lens is located to be flush with the first surface of the semiconductor substrate.

2. The image sensing device according to claim 1, wherein the substrate lens includes:
   a plurality of trench lenses in which a material film having a refractive index different from that of the semiconductor substrate is disposed.

3. The image sensing device according to claim 2, wherein the plurality of trench lenses includes:
   a first trench lens disposed at a center part of the first surface; and
   a plurality of second trench lenses formed to surround the first trench lens.

4. The image sensing device according to claim 3, wherein:
   the plurality of second trench lenses has a same width and a same depth, and
   the first trench lens has a width greater than that of each of the plurality of second trench lenses.

5. The image sensing device according to claim 3, wherein the plurality of second trench lenses has different widths or different depths based on a distance to the first trench lens.

6. The image sensing device according to claim 3, wherein the plurality of second trench lenses is arranged at different intervals between any two of the plurality of second trench lenses based on a distance to the first trench lens.

7. The image sensing device according to claim 3, wherein the plurality of second trench lenses is arranged at a same interval between any two of the plurality of second trench lenses.

8. The image sensing device according to claim 3, wherein the plurality of trench lenses further includes:
an additional first trench lenses having a width lager than that of each of the plurality of second trench lenses.

9. The image sensing device according to claim 3, wherein each of the plurality of second trench lenses has a band shape.

10. The image sensing device according to claim 1, wherein the lens layer is configured to allow the incident light to converge upon the substrate lens.

11. The image sensing device according to claim 1, further comprising:
a line layer disposed over the second surface of the semiconductor substrate, and including metal lines configured to transmit an electrical signal generated from the photoelectric conversion element.

12. An image sensing device comprising:
a photoelectric conversion element disposed in a semiconductor substrate, and configured to perform photoelectric conversion of light incident upon the photoelectric conversion element;
a substrate lens disposed over the photoelectric conversion element in the semiconductor substrate, and configured to allow incident light to converge upon the photoelectric conversion element; and
a lens layer disposed over the semiconductor substrate and configured to direct the incident light to the substrate lens which further directs the incident light to the photoelectric conversion element,
wherein a top surface of the substrate lens is located to be flush with a first surface of the semiconductor substrate.

13. The image sensing device according to claim 12, wherein the substrate lens includes:
a plurality of trenches in which material films are disposed.

14. The image sensing device according to claim 13, wherein each of the material films includes an insulation layer having a refractive index different from that of the semiconductor substrate.

15. The image sensing device according to claim 13, wherein the plurality of trenches includes:
a first trench located at a center part of the first surface of the semiconductor substrate; and
second trenches disposed to surround the first trench.

16. The image sensing device according to claim 15, wherein the second trenches have different widths or different depths according to a distance to the first trench lens.

17. The image sensing device according to claim 15, wherein the second trenches are arranged at different intervals between any two of the second trenches according to a distance to the first trench lens.

18. The image sensing device according to claim 15, wherein the second trenches are arranged at a same interval.

19. The image sensing device according to claim 15, wherein the plurality of trenches further includes an additional first trench having a width greater than that of each of the second trenches.

20. The image sensing device according to claim 13, wherein the incident light is transferred to the photoelectric conversion element through the plurality of the trenches and through a space between any two of the plurality of the trenches.

* * * * *